United States Patent
Jones et al.

(10) Patent No.: US 11,273,495 B2
(45) Date of Patent: Mar. 15, 2022

(54) MODIFIED FRAME AND RECOATING SYSTEM

(71) Applicant: GENERAL ELECTRIC COMPANY, Schenectady, NY (US)

(72) Inventors: Lucas Christian Jones, West Chester, OH (US); Jonathan Ortner, West Chester, OH (US); John Moores, Cincinnati, OH (US); Patrick Kenney, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 466 days.

(21) Appl. No.: 15/722,525

(22) Filed: Oct. 2, 2017

(65) Prior Publication Data

US 2019/0099807 A1    Apr. 4, 2019

(51) Int. Cl.
*B22F 12/00* (2021.01)
*B28B 1/00* (2006.01)
(Continued)

(52) U.S. Cl.
CPC .............. *B22F 12/00* (2021.01); *B05D 3/068* (2013.01); *B28B 1/001* (2013.01); *B29C 64/205* (2017.08);
(Continued)

(58) Field of Classification Search
CPC ....... B33Y 30/00; B33Y 40/00; B29C 64/205; B29C 64/153; B29C 64/255; B29C 64/321; B29C 64/343; B22F 12/00; B22F 12/50; B22F 12/52; B22F 12/57–58; B22F 10/10; B22F 10/28; B22F 2202/11; B22F 2998/10; B05D 3/068; B28B 1/001; C23C 16/4417
(Continued)

(56) References Cited

U.S. PATENT DOCUMENTS 8,524,142 B2    9/2013 Uckelmann et al.
9,067,360 B2    6/2015 Wehning et al.
(Continued)

FOREIGN PATENT DOCUMENTS

CN    105855548 A    8/2016
CN    106346003 A    1/2017
(Continued)

OTHER PUBLICATIONS

Herzog Frank; English Translation of EP-1439050-A1; "Coating device for an apparatus for producing articles made of pulverulent material"; (2004) (Year: 2004).*
(Continued)

*Primary Examiner* — Francisco W Tschen
*Assistant Examiner* — Edgaredmanuel Troche
(74) *Attorney, Agent, or Firm* — Dinsmore & Shohl LLP

(57) ABSTRACT

The present disclosure generally relates to methods and apparatuses for additive manufacturing with improved powder distribution capabilities. Specifically, the methods and apparatuses of the present disclosure incorporate powder distribution vanes to improve the lateral deposition of powder from a hopper. Such methods and apparatuses have the potential to reduce powder overhead costs, mitigate associated health and environmental risks, and increase manufacturing efficiency.

19 Claims, 6 Drawing Sheets

(51) Int. Cl.
  *B33Y 10/00* (2015.01)
  *B33Y 70/00* (2020.01)
  *B33Y 30/00* (2015.01)
  *B33Y 40/00* (2020.01)
  *B29C 64/205* (2017.01)
  *B29C 64/153* (2017.01)
  *B22F 10/10* (2021.01)
  *B05D 3/06* (2006.01)
  *C23C 16/44* (2006.01)

(52) U.S. Cl.
  CPC ............... *B33Y 10/00* (2014.12); *B33Y 30/00* (2014.12); *B33Y 40/00* (2014.12); *B33Y 70/00* (2014.12); *C23C 16/4417* (2013.01); *B22F 10/10* (2021.01); *B22F 2202/11* (2013.01); *B22F 2998/10* (2013.01); *B29C 64/153* (2017.08)

(58) Field of Classification Search
  USPC .......................................................... 425/375
  See application file for complete search history.

(56) References Cited

U.S. PATENT DOCUMENTS

| | | | |
|---|---|---|---|
| 9,156,056 B2 | 10/2015 | Abe et al. | |
| 9,327,450 B2 | 5/2016 | Hein et al. | |
| 2015/0323318 A1 | 11/2015 | Hess et al. | |
| 2015/0367415 A1 | 12/2015 | Buller et al. | |
| 2017/0028630 A1 | 2/2017 | Ederer et al. | |
| 2017/0057013 A1 | 3/2017 | Gillespie et al. | |
| 2017/0151727 A1 | 6/2017 | Ederer et al. | |
| 2017/0113242 A1 | 8/2017 | Giulietti et al. | |
| 2018/0043616 A1* | 2/2018 | Ikeyama | B29C 64/214 |
| 2018/0133796 A1* | 5/2018 | Kawada | B22F 10/20 |
| 2018/0345378 A1* | 12/2018 | Holford | B33Y 40/00 |
| 2021/0206087 A1* | 7/2021 | Geile | B29C 64/236 |

FOREIGN PATENT DOCUMENTS

| | | | | |
|---|---|---|---|---|
| CN | 106488819 A | | 3/2017 | |
| CN | 107107469 A | | 8/2017 | |
| DE | 102009035258 A1 | * | 2/2011 | ........... B29C 64/153 |
| EP | 1439050 A1 | * | 7/2004 | ............ B29C 41/36 |
| EP | 1439050 A1 | | 7/2004 | |
| EP | 3205483 A1 | | 8/2017 | |
| JP | 2017020081 A | * | 1/2017 | ........... B29C 64/214 |
| WO | 2015141779 A1 | | 9/2015 | |
| WO | WO-2015141779 A1 | * | 9/2015 | ............... B22C 9/02 |
| WO | WO2017143145 A1 | | 8/2017 | |
| WO | 2017180084 A1 | | 10/2017 | |

OTHER PUBLICATIONS

Herzog Frank: English Translation of DE-102009035258-A1; "Producing a three-dimensional object, comprises successively compacting layers of building material by electron beam, electromagnetic- or particle radiation, and introducing powdered materials into construction area by coating device"; (2011) (Year: 2011).*

Kawada; English Translation of JP-2017020081-A; "Lamination Molding Device"; (2008) (Year: 2008).*

Machine English Translation of Kawada et al. (WO2015141779A1). Retrieved from Espace.net https://worldwide.espacenet.com/patent/search/family/054144741/publication/WO2015141779A1?q=pn%3DWO2015141779A1 (Year: 2015).*

European Search Report Corresponding to Application No. 181645932 dated Feb. 19, 2019.

English Translation of Japanese office action for application JP2018-172079 dated Feb. 4, 2020 (11 pages).

English Translation of Chinese office action for application 201811139446.7 dated Sep. 2, 2020 (13 pages).

* cited by examiner

MODIFIED FRAME AND RECOATING SYSTEM

INTRODUCTION

The present disclosure generally relates to improved methods and apparatuses for additive manufacturing. More specifically, the present disclosure is directed to improving powder coating efficiency and coverage and supporting structures for use in methods and apparatuses for the same.

BACKGROUND

Additive manufacturing (AM) or additive printing processes generally involve the buildup of one or more materials to make a net or near net shape (NNS) object, in contrast to subtractive manufacturing methods. Though "additive manufacturing" is an industry standard term (ASTM F2792), AM encompasses various manufacturing and prototyping techniques known under a variety of names, including freeform fabrication, 3D printing, rapid prototyping/tooling, etc. AM techniques are capable of fabricating complex components from a wide variety of materials. Generally, a freestanding object can be fabricated from a computer aided design (CAD) model. A particular type of AM process uses electromagnetic radiation such as a laser beam, to melt or sinter a powdered material, creating a solid three-dimensional object.

An example of an apparatus for AM using a powdered build material is shown in FIG. 1A. The apparatus 140 builds objects or portions of objects, for example, the object 152, in a layer-by-layer manner by sintering or melting a powder material (not shown) using an energy beam 170 generated by a source 150, which can be, for example, a laser for producing a laser beam, or a filament that emits electrons when a current flows through it. The powder to be melted by the energy beam is supplied by a powder reservoir (not shown) or by a powder hopper (not shown) attached to a recoater mechanism, such as recoater arm 146, and spread evenly over a powder bed 142 using a recoater arm 146 traveling in the y-direction to maintain the powder at a level 148 and remove excess powder material extending above the powder level 148 to waste container 158. The energy beam 170 sinters or melts a cross sectional layer of the object being built under control of an irradiation emission directing device, such as a laser galvo scanner 162. The galvo scanner 162 may comprise, for example, a plurality of movable mirrors or scanning lenses. The speed at which the energy beam is scanned is a critical controllable process parameter, impacting the quantity of energy delivered to a particular spot. Typical energy beam scan speeds are on the order of 10 to 1000 millimeters per second. The build platform 144 is lowered and another layer of powder is spread over the powder bed and object being built, followed by successive melting/sintering of the powder by the laser 150. The powder layer is typically, for example, 10 to 100 microns in thickness. The process is repeated until the object 152 is completely built up from the melted/sintered powder material. The energy beam 170 may be controlled by a computer system including a processor and a memory (not shown). The computer system may determine a scan pattern for each layer and control energy beam 170 to irradiate the powder material according to the scan pattern. After fabrication of the object 152 is complete, various post-processing procedures may be applied to the object 152. Post-processing procedures include removal of excess powder by, for example, blowing or vacuuming. Other post processing procedures include a stress relief heat treat process. Additionally, thermal and chemical post processing procedures can be used to finish the object 152.

Conventional methods and apparatuses may have a powder hopper (not shown) attached to the top of recoater arm 146, as shown in FIG. 1B. The recoater arm 146 may contain a plurality of slits 168, which in conventional apparatuses are vertical, thus allowing powder flow in substantially only the vertical direction, i.e., direction 167. Subsequent motion of the recoater arm 146 in the positive y-direction then spreads or coats the powder on the build surface, e.g., build plate 144 or the last completed layer of object 152. As a result, large amounts of powder may be necessary in order to achieve an even powder coat across the build platform; an even coat across, e.g., a DMLM platform is key for part quality. Machine modifications may require powder to be distributed further than originally designed, and these effects can result in a lack of powder at the edges of the plate. For example, powder distribution systems can be hindered by the effects of chamber pressurization and powder dynamics. Furthermore, there may be environmental and health hazards associated with large quantities of powdered build materials, not to mention increased manufacturing costs. Accordingly, there is a need to maximize the efficiency of powder deposition apparatuses.

Conventional recoater arms 146 have a first end 165 and a second end 166, which can be configured to attach to support arms, such as support arm 169 (FIG. 1C), at either end of the recoater arm 146. First end 165 and second end 166 may be opposite ends of the recoater arm 146. Support arm 169 may itself contain support substructures such as those shown in FIG. 1C, such as to accommodate, at attachment point 171, first end 165 of a recoater arm 146, which then runs the length 172 to another support arm 169 at the second end 166 of the recoater arm 146. For example, Support arm 169 may have a curved surface as it approaches attachment point 171, with a narrower width in the y-direction surrounding attachment point 171. The narrower y-direction width surrounding attachment point 171 may limit the size of recoater arm 146 that can be accommodated (at least the size in the y-direction) and, in turn, the dimensions of the powder hopper that can be accommodated by recoater arm 146. The more limited the size of the powder hopper that can be accommodated, the greater the number of powder hoppers that will be necessary to build a given part; for manufacturing of large objects or parts, the need to keep cycling in a new powder hopper can drastically prolong production time. Accordingly, there is a need to be able to accommodate larger powder hoppers at a time.

SUMMARY

The following presents a simplified summary of one or more aspects of the present disclosure in order to provide a basic understanding of such aspects. This summary is not an extensive overview of all contemplated aspects and is intended to neither identify key or critical elements of all aspects nor delineate the scope of any or all aspects. Its purpose is to present some concepts of one or more aspects in a simplified form as a prelude to the more detailed description that is presented later.

In one aspect, the present disclosure is directed to a method of fabricating an object, comprising: (a) fusing at least a portion of a given layer of a given powder to form at least one fused region; (b) providing a subsequent layer of the powder, the powder being delivered down through a recoater mechanism, the mechanism having a plurality of vanes oriented at an angle to spread powder in a lateral direction toward the edges of a powder bed; and (c) repeating steps (a) and (b) until the object is formed. In some aspects, the recoater mechanism comprises a recoater arm. In some aspects, the recoater mechanism further comprises a recoater blade. In some aspects, the fusing comprises irradiating with a laser beam or with an electron beam. In some aspects, the fusing comprises binder jetting.

In another aspect, the present disclosure is directed to an apparatus for forming an object by additive manufacturing, comprising: a powder bed area defined by a build plate, the build plate adapted to lower as the object is being made; a powder fusion mechanism for fusing portions of powder within the powder bed; and a powder recoater mechanism for providing a layer of powder, the mechanism having two opposite ends and having a plurality of vanes oriented at an angle to spread powder in a lateral direction toward the edges of a powder bed. In some aspects, the powder recoater mechanism is held in plate with a first support arm and a second support arm on opposite edges of the powder bed, the first and second support arms each having a generally horizontal surface near the respective edge of the powder bed, the horizontal surface adapted to support each end of the recoater mechanism. In some aspects, the horizontal surface of each support is unobstructed in a vertical direction, allowing attachment of the recoater mechanism by lowering it into place from a vertical direction while keeping the recoater mechanism level. In some aspects, the powder recoater mechanism comprises a recoater arm. In some aspects, the powder fusion mechanism comprises an energy source. In some aspects, the energy source is a laser source. In some aspects, the energy source is an electron beam source. In some aspects, the recoater arm comprises a recoater blade.

These and other aspects of the invention will become more fully understood upon a review of the detailed description, which follows.

DETAILED DESCRIPTION

Figure 1A:
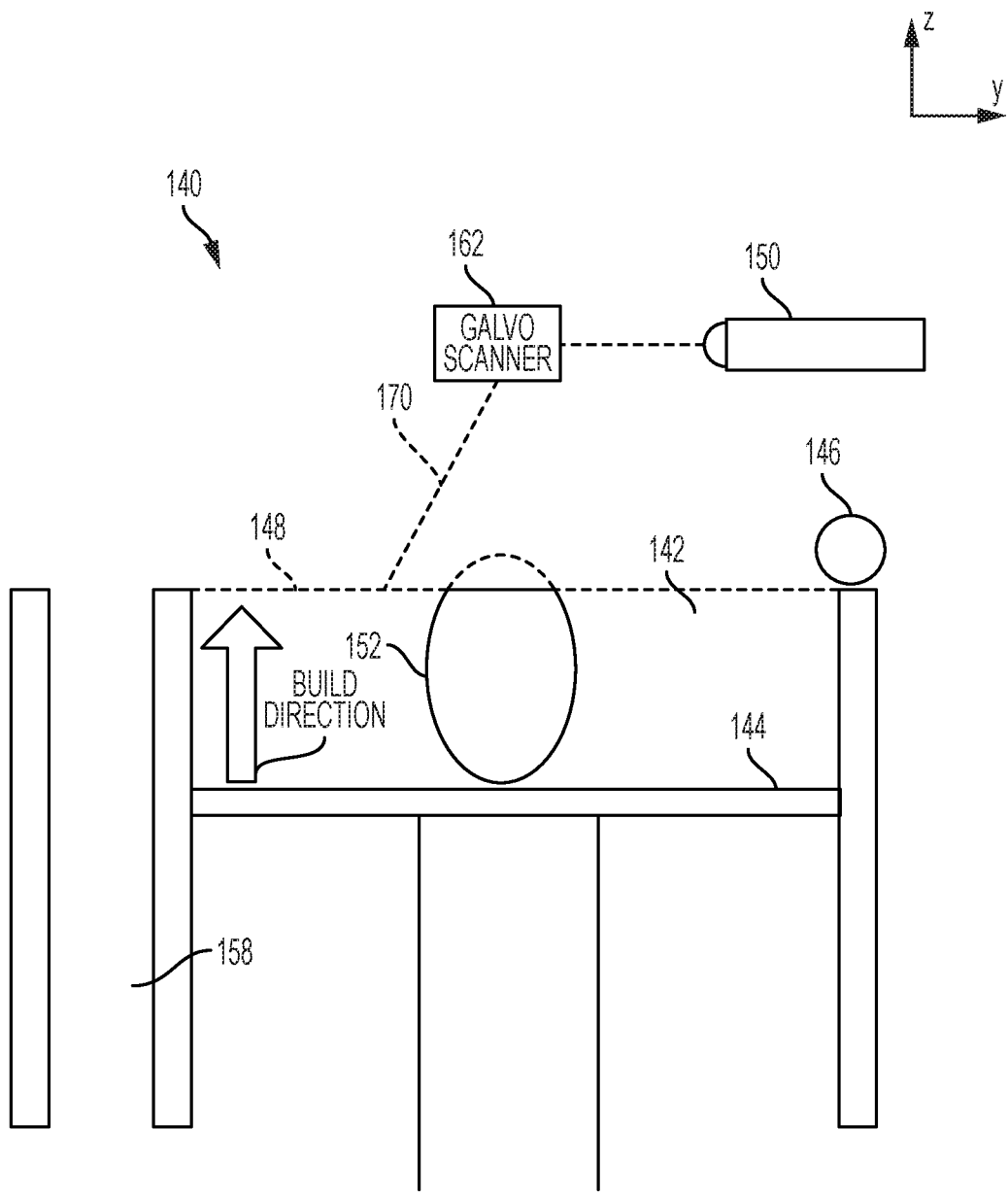
FIG. 1A shows a schematic of an example of an apparatus for AM according to conventional methods.
Figure 1B:
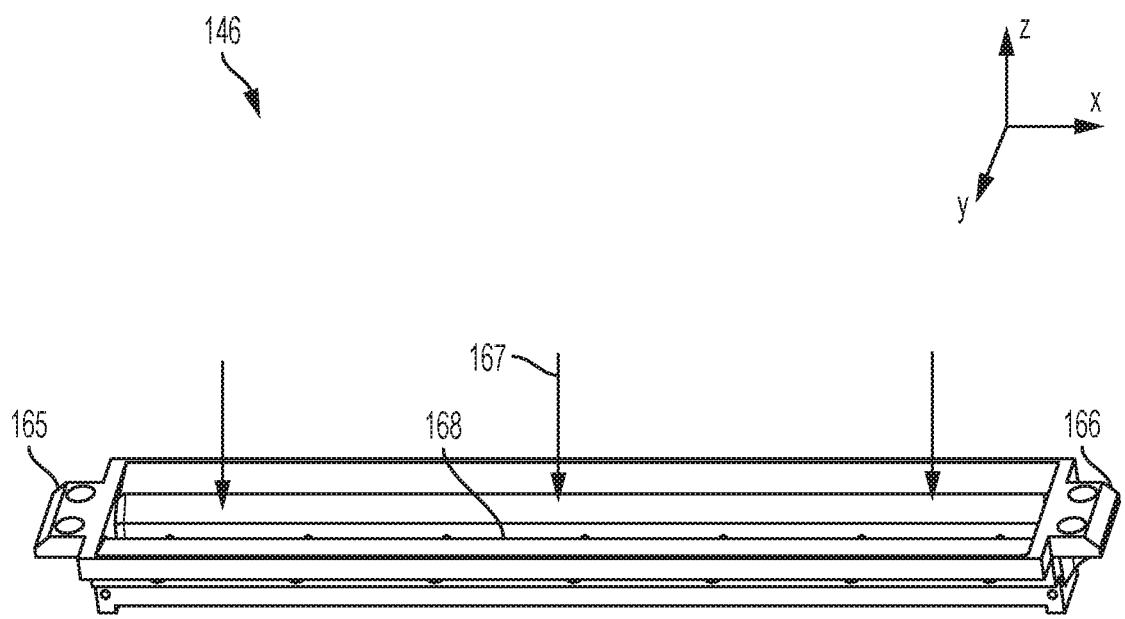
FIG. 1B shows a schematic of an example of a recoater arm for AM according to conventional methods.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

The present application is directed to methods and apparatuses for improving powder coating efficiency and coverage. As discussed above, an even powder coat across a DMLM platform is key for part quality. Powder distribution systems can be hindered by the effects of chamber pressurization and powder dynamics. Further, machine modifications may require powder to be distributed further than originally designed. These effects can result in a lack of powder at, for example, the edges of the plate. To combat this problem, vanes can be incorporated into recoater mechanisms in order to direct powder from a hopper atop the recoater to be deposited to the edge of the platform, thus improving powder distribution. Such powder distribution vanes may be built into a recoater arm directly or incorporated into an insert which may be nested into the recoater mechanism above deposition slits. The vanes may be constructed at various directions and angles from the vertical, to ensure that powder is deposited laterally or with at least a nonzero lateral component. Methods and apparatuses incorporating powder distribution vanes into recoater mechanisms, either by direct incorporation or by incorporation into inserts nested into the recoater mechanism, can reduce powder usage and keep powder distribution from becoming a limiting factor in production. Existing powder distribution systems and powder-based additive manufacturing methods and apparatuses may be leveraged in such machine expansion/modification efforts. The use of powder distribution vanes may increase the powder throughput capability of the recoating mechanism and may maximize the powder distribution capability of a given system. Vane application also allows for larger build volume (increase recoater effective width) with a minimum number of machine modifications. The vanes may utilize and leverage the potential energy of the powder height in the reservoir above the recoater to accomplish a wider layer of powder along the full distance of recoater travel without increasing other attributes of the recoater or machine interface.

In addition, recoaters incorporating directional/angled powder distribution vanes may be used with modified support arms, such as modified support brackets, to accommodate wider powder hoppers and/or wider recoater arms.

As used herein, the "vertical" direction refers to the z-direction, and "lowering" something refers to moving it downward vertically, i.e., in the z-dimension, such as in the negative z-direction.

As used herein, "at an angle" is measured relative to the vertical, i.e., the z-axis, unless otherwise specified. In some aspects, the powder recoater mechanism may contain a plurality of vanes oriented at an angle to spread powder in a lateral direction toward the edges of a powder bed. In some such aspects, the angle from the vertical may be any angle greater than 0°, up to and including 90°, such as 10°, 20°, 30°, 40°, 50°, 60°, 70°, 80°, or any integer or range in between, as may be disclosed in other sections of this specification, which are incorporated into this paragraph by reference. In some aspects, all of the plurality of vanes in the recoater mechanism may be oriented at the same angle from the vertical. In some aspects, the plurality of vanes may be oriented at a plurality of different angles from the vertical.

As used herein, the "lateral" direction refers to the horizontal direction, i.e., the xy-plane. In some aspects, the recoater mechanism may have a plurality of vanes oriented at an angle to spread powder in a lateral direction. In some such aspects, the spread of the powder has a component in the lateral direction, i.e., in the xy-plane, and also has a component in the vertical direction, i.e., the z-direction. In some of those aspects, the lateral component is greater than the vertical component. In other of those aspects, the lateral component is less than the vertical component.

As used herein, "support arms" include, but are not limited to, brackets.

Figure 2A:
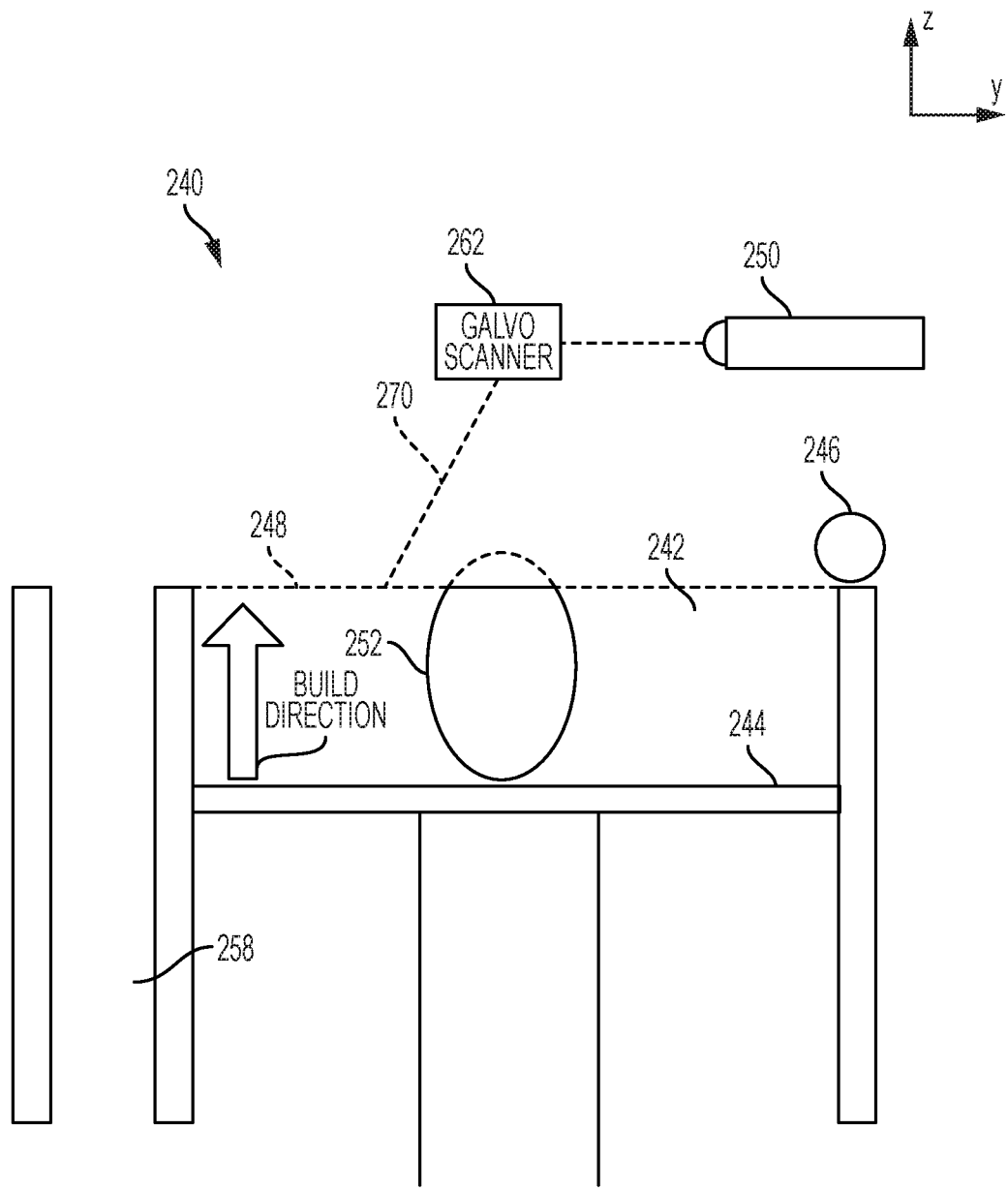
FIG. 2A shows a schematic of an example of an apparatus for AM according to some aspects of the present disclosure.

FIG. 2A shows a schematic of an example of an apparatus for AM according to the present disclosure. Apparatus 240 may be similar in some aspects to apparatus 140 (FIG. 1A).

Figure 2B:
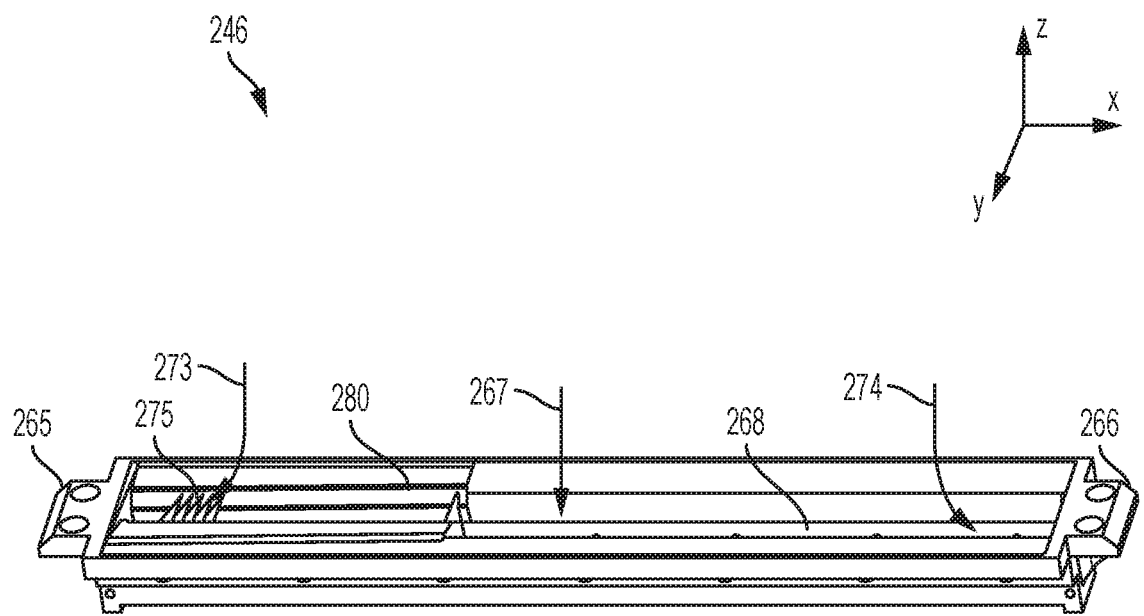
FIG. 2B shows a schematic of an example of a recoater arm for AM according to some aspects of the present disclosure.

In some aspects, the recoater mechanism, such as recoater arm 246, is a modified recoater arm, as shown in FIG. 2B. Recoater arm 246 may be similar in some aspects to recoater arm 146. Recoater arm 246 may contain a plurality of slits 268, which may be substantially vertical in some aspects. In some aspects, one or more of the plurality of slits 268 may comprise an opening that is at an angle from the vertical, such as to allow powder flow downward not only vertically (i.e., in direction 267) but also at various angles, e.g., in a first direction 273 and a second direction 274. In some aspects, an insert 280 may be nested in recoater arm 246, the insert 280 comprising a plurality of vanes 275 at one or more angles from the vertical. The plurality of vanes 275 may be generated by any suitable means known to those skilled in the art. Powder flowing from a powder hopper (not pictured) attached to the top of recoater arm 246 and insert 280, and through the plurality of vanes 275, may be spread more greatly in the x-dimension than powder flowing through the plurality of slits 168 (without directional vanes at an angle from the vertical) in recoater arm 146.

In some aspects, all of the plurality of vanes 275 are at the same angle from the vertical. In other aspects, the plurality of vanes 275 may be at a plurality of different angles from the vertical. In some aspects, the plurality of vanes 275 may be positioned at or near the first end 265 and/or the second end 266 of the recoater arm 246. In some aspects, the plurality of vanes 275 may be positioned along the full length of the recoater arm 246. In some aspects, the insert 280 may be sized to serve as a standalone recoater mechanism, without nesting into a recoater arm 246.

Figure 1C:
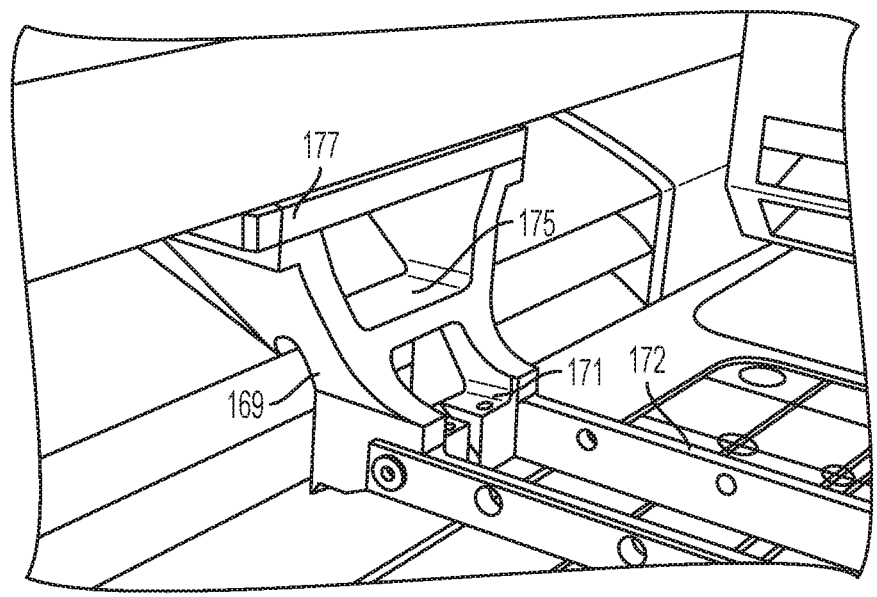
FIG. 1C shows an example of a support arm for AM according to conventional methods.
Figure 2C:
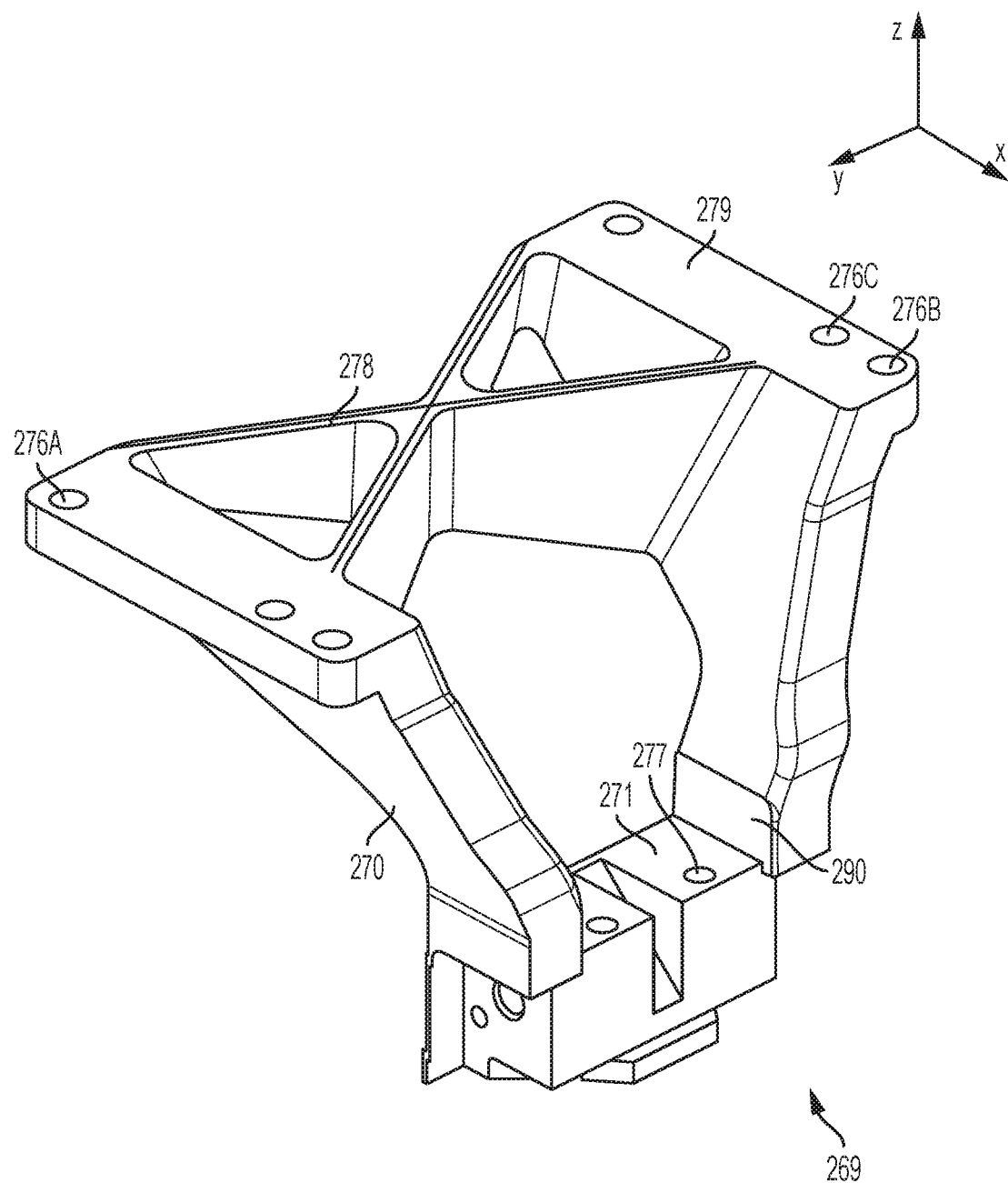
FIG. 2C shows an example of a support arm for AM according to some aspects of the present disclosure.

FIG. 2C shows an example of a modified support arm 269 for use with recoater arm 246 in apparatus 240. The support arm may include a mounting surface 279 which may comprise a substantially flat surface forming a plane that is substantially parallel with the x-y plane shown in FIG. 2C. The mounting surface may further include a series of mounting points 276A-C which may be through holes and/or threaded holes. The mounting points may be configured to line up with mounting points on the apparatus (e.g. at portion 177 shown in FIG. 1C). The support arm 269 may further include a cross brace 278 which may be substantially X-shaped. Recoater arm 246 may be held in place in apparatus 240 using the modified support arm 269, at attachment interface 271. In some aspects, the attachment interface 271 comprises a substantially flat surface forming a plane that is substantially parallel with the x-y plane shown in FIG. 2C, and side surfaces 290 which may be formed as substantially flat surfaces forming planes that are substantially perpendicular to the x-y plane. The attachment interface may further include at least one mounting point 277, which may be a through hole and/or threaded hole. The dimensions of the substantially flat surface 271, side surfaces 290, and/or mounting point(s) 277 may be dimensioned to accommodate ends 265, 266 of the recoater arm 246. When comparing the support arm shown in FIG. 1C with the modified support arm 269, the attachment interface 271 of the modified support arm 269 is moved such that the attachment interface 271 is closer to the mounting points 276A-C of the mounting surface 279 in the x direction. Thus, by moving the attachment interface 271 closer to the mounting points 276A-C in the x-direction, the modified support arm(s) may accommodate a recoater that is longer along an x-direction; allowing for a larger usable build area.

The abovementioned advantage(s) of moving the attachment interface 271 closer to the mounting points 276A-C in the x-direction may be accomplished by removing cross brace 175 shown in FIG. 1C. Further, in the example shown in FIG. 2C, the angle of down braces 270 of the modified support arm is modified to be steeper than portions 169 of the support arm shown in FIG. 1C. To compensate for the removal of cross brace 175 shown in FIG. 1C, a cross brace (e.g. cross brace 278 shown in FIG. 2C) may be added to another portion of the support arm.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

The invention claimed is:

1. A method of fabricating an object, comprising:
    (a) fusing at least a portion of a given layer of a powder to form at least one fused region;
    (b) providing a subsequent layer of the powder, the powder being delivered down through a recoater mechanism, the recoater mechanism having a plurality of planar vanes oriented at an angle greater than 0° relative to the vertical to spread the powder in a lateral direction toward an edge of a powder bed and allow powder to flow downward and in a first angled direction, wherein the planar vanes are incorporated into the recoater mechanism in order to direct powder flowing from a hopper or a reservoir to be deposited to the edge of the powder bed; and
    (c) repeating steps (a) and (b) until the object is formed.

2. The method of claim 1, wherein the recoater mechanism comprises a recoater arm.

3. The method of claim 2, wherein the recoater mechanism further comprises a recoater blade.

4. The method of claim 1, wherein the fusing comprises irradiating with a laser beam or with an electron beam.

5. The method of claim 1, wherein the fusing comprises binder jetting.

6. An apparatus for forming an object by additive manufacturing, comprising:
    a powder bed defined by a build plate, the build plate adapted to lower as the object is being made;
    a powder fusion mechanism for fusing portions of powder within the powder bed; and
    a recoater mechanism for providing a layer of powder, the recoater mechanism having two opposite ends and having a plurality of planar vanes oriented at an angle greater than 0° relative to the vertical to spread powder in a lateral direction toward an edge of the powder bed and allow powder to flow downward and in a first angled direction;

wherein the planar vanes are incorporated into the recoater mechanism in order to direct powder flowing from a hopper or a reservoir to be deposited to the edge of the powder bed.

7. The apparatus of claim 6, wherein the recoater mechanism is held in place with a first support arm and a second support arm on opposite edges of the powder bed, the first and second support arms each having a generally horizontal surface near the respective edge of the powder bed, the horizontal surface adapted to support each end of the recoater mechanism.

8. The apparatus of claim 7, wherein the horizontal surface of each of the first and second support arms is unobstructed in a vertical direction, allowing attachment of the recoater mechanism by lowering it into place from a vertical direction while keeping the recoater mechanism level.

9. The apparatus of claim 6, wherein the recoater mechanism comprises a recoater arm.

10. The apparatus of claim 9, wherein the recoater arm comprises a recoater blade.

11. The apparatus of claim 6 wherein the powder fusion mechanism comprises an energy source.

12. The apparatus of claim 11, wherein the energy source is a laser source.

13. The apparatus of claim 11, wherein the energy source is an electron beam source.

14. The apparatus of claim 6, wherein the hopper is positioned atop the recoater mechanism.

15. The apparatus of claim 6, wherein the recoater mechanism further comprises a plurality of slits spanning a length of the recoater mechanism.

16. The apparatus of claim 15, wherein the plurality of slits are oriented at an angle relative to the vertical.

17. The apparatus of claim 6, wherein the recoater mechanism further comprises an insert nested in the recoater mechanism, the insert comprising the plurality of planar vanes.

18. The apparatus of claim 6, wherein the plurality of planar vanes are positioned along an entire length of the recoater mechanism.

19. The apparatus of claim 6, wherein the plurality of planar vanes are at a plurality of different angles from the vertical.

* * * * *